United States Patent [19]

Rabalais et al.

[11] Patent Number: 4,822,466
[45] Date of Patent: Apr. 18, 1989

[54] CHEMICALLY BONDED DIAMOND FILMS AND METHOD FOR PRODUCING SAME

[75] Inventors: John W. Rabalais; Srinandan R. Kasi, both of Houston, Tex.

[73] Assignee: University of Houston - University Park, Houston, Tex.

[21] Appl. No.: 67,298

[22] Filed: Jun. 25, 1987

[51] Int. Cl.[4] ............................................. C23D 14/00
[52] U.S. Cl. ........................... 204/192.15; 204/192.22; 204/192.31; 427/38
[58] Field of Search ....................... 204/192.15, 192.22, 204/192.31; 427/38

[56] References Cited

U.S. PATENT DOCUMENTS

| | | | |
|---|---|---|---|
| 3,904,505 | 9/1975 | Aisenberg | 204/298 |
| 3,961,103 | 6/1976 | Aisenberg | 204/192.12 X |
| 4,414,085 | 11/1983 | Wickersham et al. | 204/192.15 |
| 4,490,229 | 12/1984 | Mirtich et al. | 204/192.15 X |

OTHER PUBLICATIONS

Kitabatake et al. *Journal of Applied Physics.* vol. 58, No. 4, pp. 1693–1695 Aug. 15, 1985.
Miyazawa et al, *Journal of Applied Physics*, vol. 55, No. 1, pp. 188–193, Jan. 1, 1984.
Graff, "Diamonds Find New Settings", High Technology, 7(4) (1987) 44–48.
Aisenberg et al., "Ion-Deposition of Thin Films of Diamondlike Carbon", J. Appl. Phys., 42 (1971) 2953–2958.
McFeely et al., "X-ray Photoemission Studies of Diamond Graphite, and Glassy Carbon Valence Bands", Phys. Rev., B9 (1974) 5268–5278.
Taylor et al., "Interactions of $N_2^+$ and $NO^+$ Ions With Surfaces of Graphite, Diamond, Teflon, and Graphite Monofluoride", J. Amer. Chem. Soc., 100 (1978) 4441–4447.
Pate, "The Diamond Surface: Atomic and Electronic Structure", Surf. Sci., 165 (1986) 86–142.
Lurie "The Diamond Surface II. Secondary Electron Emission", Surf. Sci., 65 (1977) 476–498.
Pepper, "Electron Spectroscopy of the Diamond Surface", Appl. Phys. Lett., 38 (1981) 344–346.
Kang et al., "Chemical Sputtering of Nickel Oxide and Carbide by Low Energy (5–20 eV) $C^+$ and $O^+$ Beams", J. Chem. Phys., 86(6) (1987) 3753–3755.

(List continued on next page.)

Primary Examiner—Brian E. Hearn
Assistant Examiner—Stephen J. Kalafut
Attorney, Agent, or Firm—Arnold, White & Durkee

[57] ABSTRACT

This invention comprises a method by which a carbon based film is deposited by ion beam deposition upon and chemically bonded to a substrate article. The carbon based film deposited by the method of this invention comprises an atomic initial layer, adjacent to and chemically bonded by carbide bonding to the substrate surface, which is overgrown by a carbon layer that assumes the true diamond microstructure or, alternatively, a carbon structure which more closely approximates the microstructure and physical, chemical and electrical properties of true diamond than has heretofore been attained by prior diamond-like films.

The method by which the chemically bonded diamond or diamond-like film is deposited upon a substrate comprises: positioning an electrically grounded substrate having an atomically clean surface within a deposition chamber maintained at a pressure of $1 \times 10^{-9}$ torr or less and impinging upon the atomically clean substrate surface a $^{12}C^+$ ion beam having a beam energy in the range 10–300 eV and using a dose no greater than that defined by region AB of FIG. 1 in order to form a carbon layer bound to said substrate by carbide bonding; thereafter the $^{12}C^+$ Ion beam is increased in dose to a level at least as great as that defined by of region BC of FIG. 1 and impingement of such $^{12}C^+$ ion beam on the substrate is continued for a time sufficient to overlay said substrate carbide bonded carbon layer with a diamond layer of the thickness desired.

7 Claims, 9 Drawing Sheets

OTHER PUBLICATIONS

Kang et al., "Kinetic Energy Dependence of Molecular and Dissociative Reactions of CO+ With a Ni(111) Surface in the Range 3–20 eV", Chem. Phys. Letters, 128(4) (1986) 348–353.

Moravec et al., "Electron Spectroscopy of Ion Beam and Hydrocarbon Plasma Generated Diamondlike Carbon Films", J. Vac. Sci. Technol., 18(2) (1981) 226–228.

Weissmantel, *Thin Films From Free Atoms and Particles*, Academic Press Inc. (1985), Chap. 4, "Preparation, Structure and Properties of Hard Coatings on the Basis of i-c and i-BN", 153–201.

Green et al., "Surface Analysis of Diamondlike Carbon Films", J. Vac. Sci. Technol. A. 1(4) (1983) 1877–1879.

Spencer et al., "Ion-Beam-Deposited Polycrystalline Diamondlike Films", App. Phys. Letters, 29(2) (1976) 118–120.

Hu et al., "Ion Beam Nitridation of the First-Row Transition Metals", J. Phys. Chem., 85 (1981) 2459–2463.

Baldwin, "Kinetics of $N_2^+$ and $N^+$ Reactions with Mo at $\leq 100$ eV Impact Energies", Surface Science, 141 (1984) 617–638.

Shamir et al., "Reactions of Homonuclear Diatomic Ions With Metal Surfaces. II. Nitridation of Al, Cu, Mo, and Ni by $N_2^+$ Beams in the Low Kinetic Energy-Near Threshold Region", J. Chem. Phys. 73(12) (1982) 6417–6424.

Darko et al., "Reactions of Homonuclear Diatomic Ions with Metal Surfaces. I. Model for $X_2^+$ Beam-Surface Reactions in the Low Kinetic Energy-Near Threshold Region", J. Chem. Phys., 76(12) (1982) 6408–6416.

Anttila et al., "Comparison of Diamondlike Coatings Deposited with $C^+$ and Various Hydrocarbon Ion Beams", Appl. Phys. Lett., 50(3), 1987, 132–34.

Anttila et al., "Density Measurements of Diamond-Like Coatings Using a Low Energy Accelerator", Thin Solid Films, 136 (1986), 129–134.

Chaikovski et al., "Deposition of Diamond Films From Beams of Carbon Ions", Sov. Phys. Crystallogr., 26(1) 1981, 122–24.

CHEMICALLY BONDED DIAMOND FILMS AND METHOD FOR PRODUCING SAME

Diamond, besides being the hardest substance known, also exhibits extremely high optical transparency, chemical inertness, dielectric strength, electrical resistivity, and thermal conductivity. Such properties make diamond a highly attractive film coating material for a wide range of substrate articles.

A method for depositing a diamond film on a substrate article would make possible the production of many articles heretofore unattainable. Sharper and more durable machine tools, cutting tools, knives and surgical scalpels could be made by application of a diamond film to such articles. Data storage disks, or aircraft windows, if coated with a diamond film, could be made abrasion resistant. Diamond film coated optical lens would be scratch resistant. Silicon or other substrate materials like nickel, if coated with a diamond film, could be employed for the production of high density computer chips and high power semiconductors. Transistors can be fabricated from diamond by adding dopants to make them semiconductors. Such transistors could handle high-power signals at the microwave frequencies used in earth-to-satellite links. Diamiond-like power transistors can be used for generating intense ultraviolet laser beams for satellite-to-satellite communications.

The unique properties of diamond has lead to attempts to deposit thin diamond films on various substrates Various methods have been tried for depositing a diamond film on a substrate. The deposition methods tried have included radio frequency and direct current plasma decomposition of a hydrocarbon gas, pulsed plasma hydrocarbon decomposition in a coaxial generator, hydrocarbon ion plating, argon ion bombardment of evaporated carbon films, sputter deposition, and low-energy ion beam deposition. Such techniques have produced carbon based film coatings exhibiting a wide variety of properties, including color, hardness and electrical insulating properties. Diamond-like films have been reportedly produced by some of the techniques. The designation of "diamond-like" carbon was introduced by Aisenberg and Chabot, *J. Appl. Phys.*, 42, 2953 (1971). Although a diamond-like film may have many physical properties similar to that of true diamond, the microstructure of a diamond-like carbon film differs greatly from that of true diamond.

The technique of chemical vapor deposition has perhaps been the one most widely attempted for deposition of diamond films on a substrate. In chemical vapor deposition a hydrocarbon is pyrolyzed, by heat or radiation, to an ionized gas-electron mixture which is allowed to deposit on an exposed substrate. To inhibit the formation of the graphite form of carbon in the deposited film, hydrogen or a hydrogen plasma is added to the hydrocarbon before it is decomposed. The resulting films are diamond-like, rather than diamond, and contain an undesirable content of hydrogen.

Ion beam deposition, a technique wherein a substrate is bombarded by high velocity ions, has also been attempted as a method for depositing diamond films by using a hydrocarbon as a source of carbon ions. Again, films reported to have been deposited by such a technique are diamond-like rather than true diamond films.

Experiments with low-energy reactive ion bombardment of surfaces using ions of carbon, nitrogen, and oxygen have shown that both the gaseous reaction products and the surface film growth and properties are very sensitive to the energy and momentum of the impingent beam species Solid state phases in the surface region that are far from thermodynamic equilibrium, such as unusual metastable structures, can be formed due to the condition of high available activation energy which is rapidly quenched by the solid. An example of this is the production of insulating carbon films by a variety of plasma and ion beam techniques. These carbon based films have been shown to be mechanically hard, chemically resistant, and optically transparent, while having a resistivity, refractive index, lattice constant, dielectric constant, optical absorption edge, and valence-band structure similar to that of diamond. Hence, the appellation 'diamond-like' films has developed, even though the properties of these films can vary considerably depending upon the method of production. The growth mechanism and optimum conditions for obtaining 'diamond-like' properties for such films are of obvious interest. The nature of these carbon films has not been studied in situ under carefully controlled conditions of ion type, energy and dose in an ultraclean environment. Miyazawa et al, *J. Appl. Phys.* 55, 188 (1884) used mass and energy selected carbon ion beams for film production, however they did not have ultra-high vacuum conditions and surface analysis tools in the deposition chamber; these features are necessary in order to obtain pure diamond films and to fully characterize the film growth. Ion beam deposited carbon films are in metastable amorphous or quasi-amorphous states whose relative stability and physical properties may be strongly dependent on incorporation of constituents, e.g. hydrogen, oxygen, etc. within the structure.

It is desirable to develop a deposition method which provides a strongly adhered, preferably a chemically bonded, pure carbon film on a substrate article which is of a true diamond composition or, alternatively, which more closely approximates the microstructure and physical properties of true diamond than has been attained with carbon based diamond-like films depositable by techniques heretofore used.

SUMMARY OF THE INVENTION

This invention comprises a method by which a carbon based film is deposited by ion beam deposition upon and chemically bonded to a substrate article. The carbon based film deposited by the method of this invention comprises an atomic initial layer, adjacent to and chemically bonded by carbide bonding to the substrate surface, which is overgrown by a carbon layer that assumes the true diamond microstructure or, alternatively, a carbon structure which more closely approximates the microstructure and physical, chemical and electrical properties of true diamond than has heretofore been attained by prior diamond-like films.

The method by which the chemically bonded diamond or diamond-like film is deposited upon a substrate comprises: positioning an electriclly grounded substrate having an atomically clean surface within a deposition chamber maintained at a pressure of $1 \times 10^{-9}$ torr or less ($1.33 \times 10^{-7}$ Pa or less) and impinging upon the substrate surface a $^{12}X^{C+}$ ion beam having a beam energy in the range 10–300 eV and using a dose no greater than that defined by region AB of FIG. 1 in order to form a carbon layer bound to said substrate by carbide bonding; thereafter the $^{12}C^+$ ion beam is increased in dose to a level at least as great as that defined by region BC of FIG. 1 and impingement of such $^{12}C^+$ ion beam on the substrate is continued for a time sufficient to overlay said substrate carbide bonded carbon layer with a diamond layer of the thickness desired.

Diamond or diamond-like films produced on a substrate according to the method of this invention exhibited carbon Auger electron spectroscopy (AES) lineshapes which evolved from that characteristic of carbide at the layer interfacing with the substrate surface to that of a true diamond microstructure for the film layer overlying the carbide interface film layer. Measurement of the film properties by the techniques described establishes that the films produced according to the invention have properties comparable to true diamond as follows refractive index by ellipsometry is in the range 2.25-2.57 (true diamond 2.41); UPS exhibits a recession of the p$\pi$ bands near the Fermi level resulting in a band gap which evidences the electrical insulating characteristics of the film; XPS exhibits the energy loss features of the film associated with C 1s ionization which are identical to that of pure diamond; EELS and KSIL show energy loss features of the film which are identical to those of pure diamond; LEED measurements show the film is either polycrystalline or amorphous. No chemisorption of $O_2$ by the overlaying diamond film layer is detectable. The $O^+$ sputtering yield of the overlaying diamond layer at $O^+$ energies of 20-30 eV is less than a few tenths.

DESCRIPTION OF THE PREFERRED EMBODIMENTS

Carbon films may be deposited on a substrate surface by impinging thereon a 1-300 eV mass-selected $^{12}C^+$ ion beam. Provided that the substrate surface is prepared to be atomically clean and is maintained in an atomically clean state during exposure to the $^{12}C^+$ ion beam, by appropriate control of the $^{12}C^+$ beam dose and energy, the carbon film may be deposited as an initial carbide structure which is chemically bonded to the substrate surface then overlayed with carbon layers that may be evolved into a diamond layer by prolonging the time of bombardment of the substrate to increase the beam dose. The composite carbon film is an anterior surface diamond film chemically bound to the substrate surface by a posterior carbide layer which interfaces with and is chemically bound to the substrate surface. Monitoring of the carbon Auger line-shape during film deposition confirms the formation of a carbide bound layer which evolves with increasing $^{12}C^+$ dose into a diamond structure for ion energies in the range of about 10 to 300 eV, preferably about 30 to about 180 eV.

Figure 1:
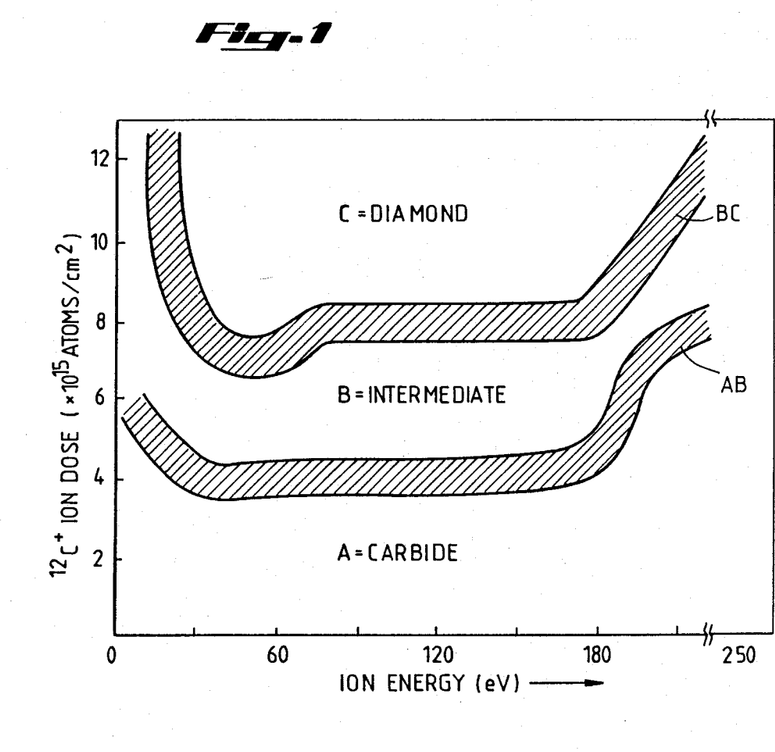
FIG. 1 is a a graph of the $^{12}C^+$ beam dose measured as ions/cm$^2$ versus the kinetic energy measured as eV at which such a $^{12}C^+$ ion beam impinges on a nickel substrate having an atomically clean surface. Region A defines the domain of beam dose and energy at which a carbide bonded carbon layer will be formed on the substrate surface. Region C defines the domain of beam dose and energy required to overlay the carbide bound carbon layer with a diamond layer. Region B defines the domain of beam dose and energy at which a carbon layer intermediate in structure to that the carbide bonded and the diamond layer is formed. Regions AB, and BC indicate the areas of experimental uncertainty in the $^{12}C^+$ beam dose and energy boundary distinction between carbide formation domain A, intermediate domain B, and diamond domain C.
Figure 2:
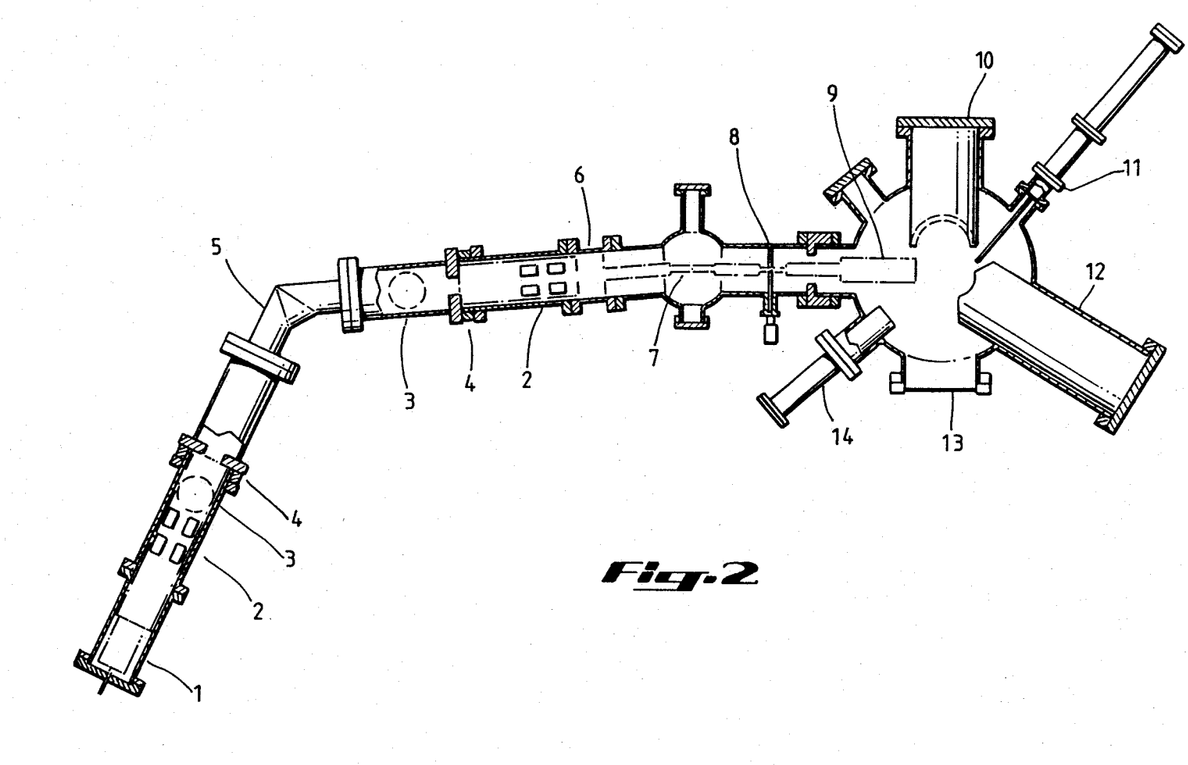
FIG. 2 is a schematic drawing in top view of an ion beam deposition apparatus which may be employed for the practice of the method of the invention.
Figure 3:
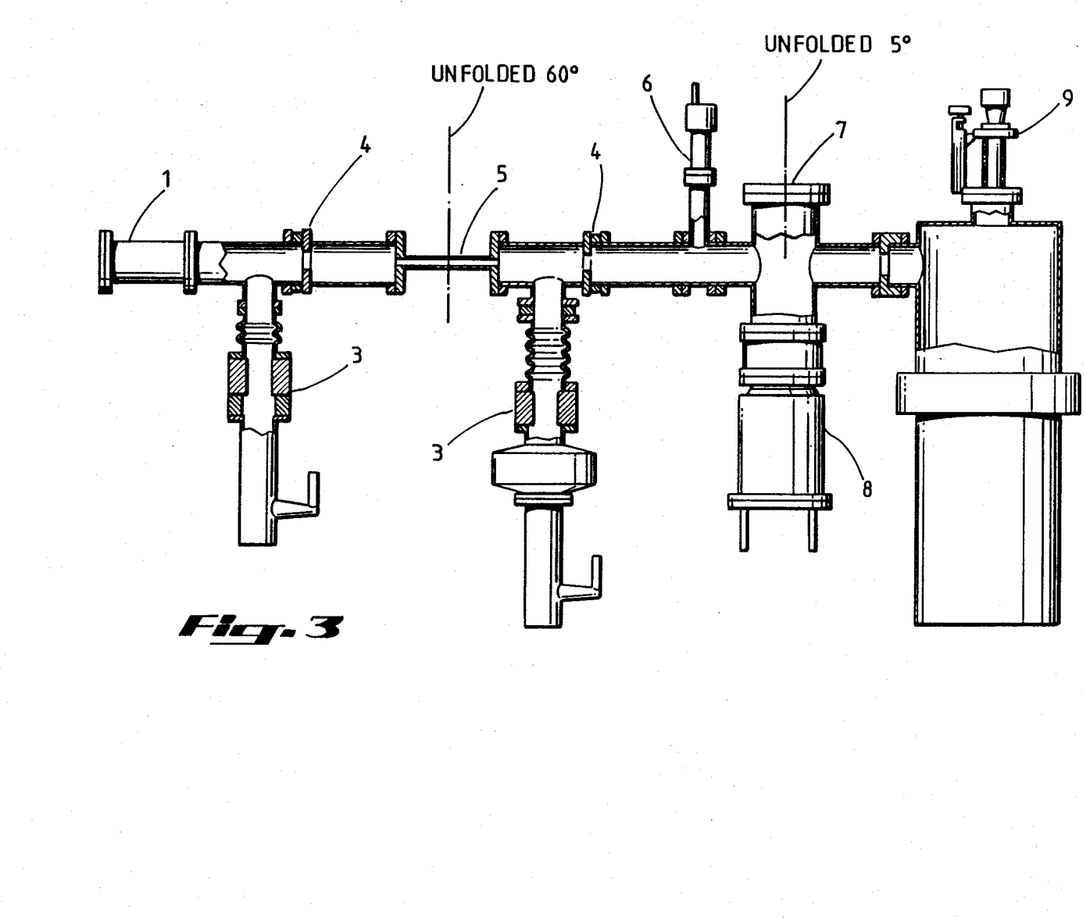
FIG. 3 is a schematic drawing in side view of the ion beam deposition apparatus of FIG. 2.

FIGS. 2 and 3 illustrate an apparatus by which the method of this invention may be practiced. The apparatus consists of an ion accelerator attached to a surface analysis chamber. The requirements of the system are a low-energy ion beam that is mass selected and has a narrow energy spread; efficient differential pumping to keep the source gas out of the collision chamber; and an ultra high vacuum (UHV) collision chamber with facilities for positioning and for cleaning (sputtering and annealing) the substrate article to be coated. Also illustrated as an integral unit of the apparatus are in situ analytical techniques for characterizing the surface.

The components comprising the deposition apparatus of FIGS. 2 and 3 are: an ion source and gas inlet 1; electrostatic quadrupole doublets 2; vacuum pumping port 3; ceramic isolator for flight tube 4; a 60° sector electromagnet 5; a gate valve 6; 6° deflector plates 7 (to eliminate fast neutrals) and turbomolecular pumping stage; rotatable flap serving as a differential pumping baffle and beam aperture 8; decelerator lens 9; LEED-/AES hemispherical grid analyzer 10; He I/He II UPS source 11; CMA analyzer 12; viewport 13; and residual gas analyzer (RGA) mass spectrometer 14. For time-of-flight (TOF) scattering and recoil measurements, LEED/AES analyzer 10 is replaced by a mass spectrometer/TOF drift tube and RGA mass spectrometer 14 is replaced by pulsed mass-selected rare gas ion scattering source The X-ray source for XPS is located out of plane above the UV source. The electron gun for AES is on the CMA axis. The surface analysis chamber is a 14 in. stainless steel bell jar. It contains a cylindrical mirror analyzer (CMA) with X-ray and UV source for photoelectron spectroscopy (XPS and UPS) and an electron gun for Auger electron spectroscopy (AES), a 180° hemispherical retarding grid for low energy electron diffraction (LEED), and a quadrupole mass spectrometer. To perform time-of-flight (TOF) ion scattering and direct recoiling, the mass spectrometer/TOF drift tube is placed in the position of the LEED optics and a pulsed mass-selected rare gas ion source is placed in the position of the RGA mass spectrometer; this provides a scattering and recoiling angle of 30° and a flight path of 32.5 cm. The chamber is pumped by means of a 500 l/s turbomolecular pump, a 250 l/s ion pump, and a titanium sublimator with liquid nitrogen cooled cryobaffle. The resulting base pressure in the deposition chamber is $3 \times 10^{-11}$ torr. It is essential that the deposition chamber be maintained at a pressure of $1 \times 10^{-9}$ torr or less when depositing a carbon film on an atomically clean substrate surface. If a pressure greater in magnitude than $1 \times 10^{-9}$ torr is permitted to develop in the deposition chamber the substrate surface will be contaminated with mono or multi layers of oxygen, hydrogen, water vapor, carbon monoxide, or other residual gas components which interfere with and preclude the ability of forming an initial carbide chemically bound carbon layer on the substrate surface by $^{12}C^+$ ion beam bombardment as hereafter described. Further, if a pressure greater in magnitude than about $1 \times 10^{-9}$ torr is permitted to develop in the deposition chamber while deposition is ongoing then the residual gas constituents will become incorporated or entrapped within the carbon film being deposited and will adversely affect the ability to evolve the film into one of a diamond structure The beam line consists of an ion source, lens transport system, mass analyzer, and decelerator. Construction is of stainless steel with copper-sealed flanges except in the ion source and mass analysis regions where viton O-rings are used. Four stages (FIG. 3) of differential pumping are used in order to reduce the pressure from $1 \times 10^{-4}$ torr in the ion source region to a working pressure of $2 \times 10^{-10}$ torr or less in the deposition chamber. The source and mass analysis regions are pumped by two separate 325 l/s oil trapped diffusion pumps using polyphenyl ether oil; the entrance and exit apertures of the mass analyzer (each 2 mm wide $\times$ 1.5 cm high) serve as differential pumping baffles. The region of the 6° bend (FIG. 2) is pumped by means of a 500 l/s turbomolecular pump and a 3 mm diameter circular aperture admits the beam into the main chamber.

The low-energy ions are produced by a Colutron ion source with the ionization region maintained at 1–300 eV above the grounded sample. This is a plasma type source which produces small size (2 mm diameter) intense beams with a narrow energy (0.1–0.2 eV) spread. The ions are extracted from the ionization region by means of a drawout plate after which they are accelerated to 1500 eV (the fixed energy chosen for mass analysis) by means of a two-tube accelerating lens. All of the beam components following this lens (with the exception of the decelerator) are floating at −1.5 kV. An electrostatic quadrupole doublet receives the beam from the accelerator lens. The quadrupole doublet projects the beam through the entrance slit of the magnetic analyzer and an identical quadrupole doublet receives the beam after it emerges from the exit slit of the mass analyzer. This component acts as a stigmatic lens which is capable of having different magnifications in two perpendicular planes so that the beam shape can be converted from circular to rectangular (for mass analysis) and then back to circular. The mass analyser is a 60° sector electromagnet for which the m/e species is selected by varying the current through the magnet. The vacuum housing of the mass analyzer is electrically isolated from the rest of the vacuum housing and pumps so that it can be floated at a potential of −1.5 kV with respect to the ion source.

The beam emerging from the exit of the mass analyzer is reshaped by the exit quadrupole doublet lens and then drifts at 1.5 keV through a parallel plate condenser which bends it by 6° in order to eliminate the line-of-sight neutral beam that emanates from the mass analyzer. The beam passes the final aperture into the deceleration lens which is located in the deposition chamber directly in front of the substrate. In this manner the ions are decelerated close to the substrate, maximizing ion current and minimizing space charge dilation. The deceleration lens can be operated in either the step-potential or exponential potential gradient retardation mode. The former mode is employed by floating all 34 decelerator plates at 1.5 kV while placing three variable plates at the exit end of the lens near ground potential. A Faraday cup (1.32 mm diam.) mounted on the substrate manipulator is used for monitoring the ion flux.

The total beam path length is 2.4 m from source to target, providing long drift times for relaxation of excited species formed in the source. For low-mass ions this time for relaxation is the sum of the flight time through the beam line (approximately 25 microseconds) and the residence time in the source (estimated to be 10–30 microseconds). Ion current densities of up to $10 \mu A/cm^2$ were achieved for a 150 nA beam of which 135 nA was focussed into the Faraday cup (0.0137 $cm^2$). This corresponds to approximately $6 \times 10^{13}$ ions/$cm^2$ sec striking the surface More typically, 60 nA currents in the Faraday cup were used, giving $3.6 \mu A/cm^2$ and $2.3 \times 10^{13}$ ions/$cm^2$sec. Below 7 eV the current decreases rapidly, while above this value it increases monotonically; this suggests that space-charge expansion at below 7 eV is the limiting effect on the final ion current. Transmission through the beam line is independent of the final energy since all voltages are referenced to the potential of the ionization region; when this potential changes, every other voltage changes with it. Thus when the potential of the ionization region is varied with respect to the grounded substrate target (to vary the final beam energy), the velocities, and hence transmission characteristics of the ions in the beam, do not change. All changes with varying beam energy occur in the step-potential decelerator.

Approximate current density profiles of the beam were obtained by two methods: (1) scanning the Faraday cup aperture through the beam and (2) by depositing a reactive species on a surface and using AES to monitor the reacted spot by scanning the surface using the AES electron beam. The beam current is stable over a period of hours to within 2%. Experiments with apertures showed that the beam angular divergence is <1% before the deceleration region and increases substantially beyond this region up to values <6%.

$C^+$ ion beams can be produced by a variety of ion sources, such as electron impact, plasma, sputtering, and discharge sources. In the particular apparatus illustrated by FIGS. 2 and 3, the $C^+$ ions are produced by admitting a carbon containing gas into the discharge region. Carbon containing gases suitable for production of $C^+$ ions include CO, $CO_2$, and hydrocarbons. Carbon monoxide was used in the apparatus illustrated by FIGS. 2 and 3. A typical composition breakup of the ensuing ion flux for a CO gas is $CO^+(78\%)$, $C^+(18\%)$, and $O^+(4\%)$. The individual ions are mass selected by varying the current through the magnetic sector and are focused on the sample target by tuning the electrostatic lenses. The substrate article target is atomically cleaned preferably by rare gas ion sputtering and electron beam annealing to temperatures just below the substrate melting point. In the apparatus of FIGS. 2 and 3, for a Ni substrate, 3 keV $Ar^+$ ions were used and annealing was done at 900° C. LEED is used to check the surface structure following this cleaning procedure. Maintenance of the deposition chamber at a pressure of $1 \times 10^9$ torr or less is required to prevent recontamination of the atomically clean substrate surface.

The apparatus of FIGS. 2 and 3 was utilized to deposit a carbon based film on a nickel substrate as follows. Briefly, $C^+$ ions generated by electron impact of CO gas were extracted from the ion source region at the potential of interest, accelerated to high energy, mass selected to pass 12 $C^+$, and transported through a long flight tube designed to eliminate fast neutrals. The ions were decelerated just prior to impact with the nickel substrate target. Efficient differential pumping of the beam line allows maintenance of the system pressure in the low $10^{-10}$ torr range during exposure to the $C^+$ ions. The $C^+$ beam currents were in the range of 10-100 nA in a spot size of 0.12 cm² with an energy spread of ~1 eV. The nickel substrate target was a single crystal of Ni with a polished (111) surface which was cleaned by 3 keV $Ar^+$ sputtering and electron beam annealing to 900° C. before ion bombardment. The techniques of Auger electron spectroscopy (AES), X-ray and UV photoelectron spectroscopy (XPS and UPS), and direct recoil (DR) spectrometry were available in the UHV chamber for sample analysis. The total impurity level (sum of H, C, and o) on the nickel substrate surface after cleaning was <1% of a monolayer as determined by DR spectrometry; AES detected no C or o under these conditions.

In a typical procedure, the ion energy was fixed in the range 10-300 eV and a clean Ni surface was irradiated with a $C^+$ flux that was predetermined in a Faraday cup mounted on the substrate holder; with ion currents of 25 nA, 4-5 hours irradiation time was required for a dose of $2 \times 10^{16}$ ions/cm². The beam was interrupted at fixed dose intervals by closing a gate valve in the beam line and AES spectra were measured in the derivative mode, i.e., dN/dE, by means of double-pass cylindrical mirror analyzer using a low current (2µA) electron beam at 1.6 keV. The highly surface sensitive DR technique was used to monitor the carbon and the impurity hydrogen and oxygen level; the impurities were found to be negligible.

Figure 4:
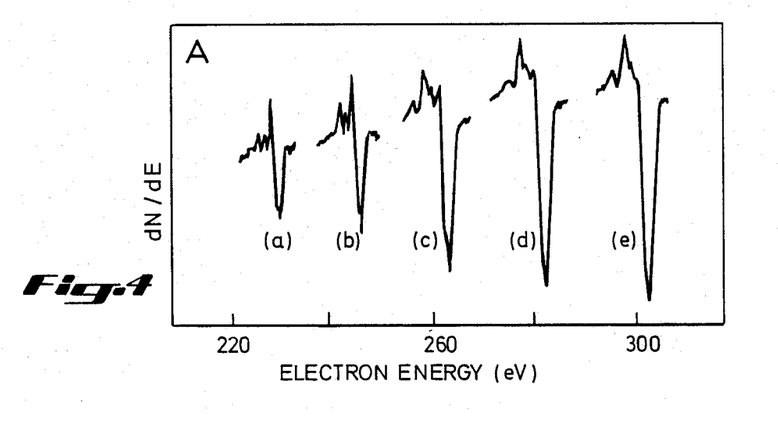
FIG. 4 illustrates the evolution of the carbon Auger electron spectroscopy (AES) line shape as a function of ion dose for an 11 eV $^{12}C^+$ ion beam for a carbon film deposited on a nickel substrate. The film evolved from carbidic (a) to diamond (e) as the ion beam dose was increased as indicated.
Figure 5:
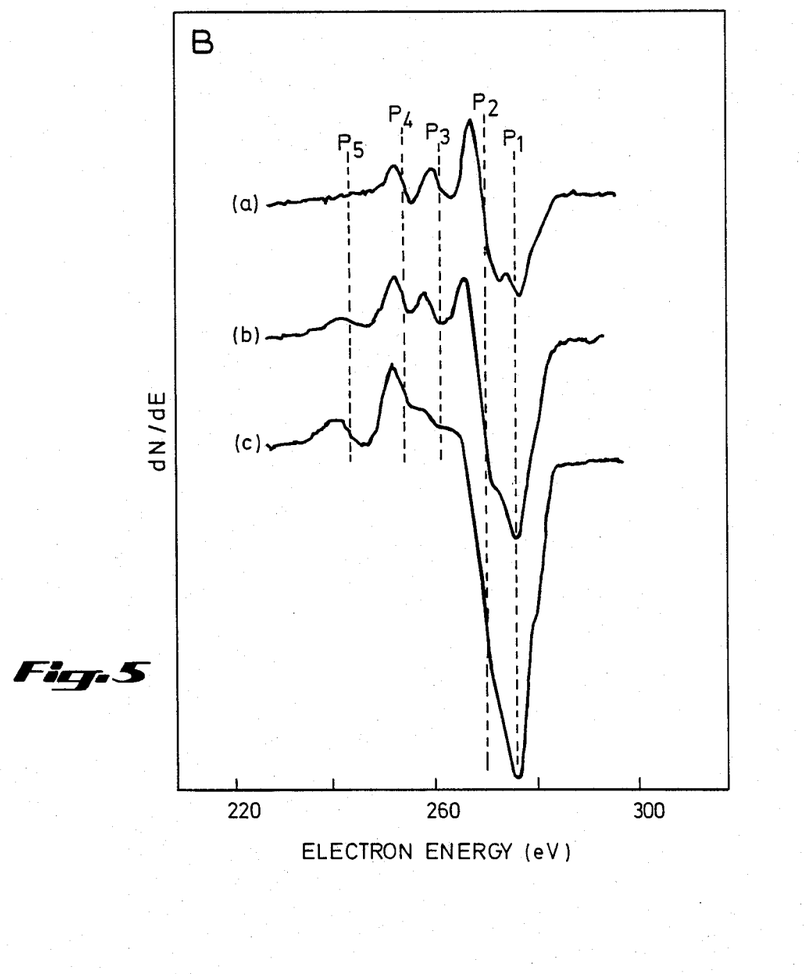
FIG. 5 illustrates the evolution of the carbon AES line shape as a function ion beam dose for a 50 eV $^{12}C^+$ ion beam for a carbon film deposited on a nickel substrate. Evolution of the film from carbidic (a) to diamond (c) as a function of beam dose is shown.

FIG. 4 shows the evolution of the carbon AES line shape as a function of dose for an 11 eV $C^+$ beam and FIG. 5 is a representative spectra for a 50 eV $C^+$ beam at three specific doses, shown on an expanded scale. The positions of the peak maxima, labeled $P_i$, along with their spectral assignments for FIGS. 4 and 5 are listed in Table I. The assignments are made by comparison to band structure calculations for diamond and graphite, both of which exhibit three principal valence band maxima, and to previous experimental measurements. The intensity pattern $P_2$, $P_3$, and $P_4$ is the characteristic signature of a metal carbide. Nickel carbide has a very narrow valence band, providing a wide separation between the penultimate carbon $L_1$ level and the outer $L_{2,3}$ valence bands; the result is an AES spectrum with several sharp structures. As the $C^+$ dose increases the lineshapes gradually evolve, through an increase in $P_1$, $P_4$, and $P_5$ and a decrease in $P_2$ and $P_3$, to a final lineshape (e) at high dose that is identical to previously reported spectra for 'diamond-like' films. The broadening to the $P_1$ to $P_4$ structures is in concert with the broadening of the valence bands for diamond or graphitic structures; $P_5$ has been identified as a plasmon loss structure. The observed 'diamond-like' signature differs from that of either pure graphite of pure single-crystal diamond, a result which may indicate that there are domains of both allotropes as suggested previously. The electron beam damage as has been observed on pure diamond crystals was observed on these samples.

TABLE I

| Peak | Energy (eV) | Assignment |
| --- | --- | --- |
| $P_1$ | 275.9 | $KL_{2,3}L_{2,3}$ |
| $P_2$ | 269.7 | |
| $P_3$ | 261.6 | $KL_1L_{2,3}$ |
| $P_4$ | 254.3 | $KL_1L_1$ |
| $P_5$ | 242.9 | Plasmon Loss |

The evolution of the above structures was found to be strongly dose and energy dependent in the 1-300 eV region studies. Referring to FIG. 4 for the lineshapes, structure (a) was obtained for initial doses $<4 \times 10^{15}$ ions/cm² over the entire energy range. Over the range $10 < E < 175$ eV, the sequence of lineshape changes shown in FIG. 4 was obtained. For $E < 10$ eV, the lineshape evolved only to stage (c) and never reached the final (e) stage within the limits of dosing capability. For $E > 175$ eV, significantly higher ion doses than those of FIG. 4 are required to reach each stage, i.e., (a)-(e), of the evolution process.

The $O_2$ chemisorption and $O^+$ sputtering of the carbon films were tested in situ on structures (a) and (e) of FIG. 4. For chemisorption, the films were exposed to 80 L of $O_2$ after which the AES spectrum was monitored. Oxygen was found to chemisorb readily on (a) with a resulting 50% decrease in the carbon AES signal and simultaneous formation of NiO. No chemisorption was detectable on (e) nor was there any noticeable carbon removal The results of low energy $O^+$ sputtering showed that (a) has a sputtering yield of S=1 even below 10 eV, while (e) has a yield of only a few tenths even at $O^+$ energies of 20-30 eV. Preliminary thermal desorption studies show that the (a) type films are completely desorbed below 440° C. while the (e) type films are stable up to temperatures at least 150° higher.

These results show that ion beam deposited carbon films on Ni(111) form an initial reactive carbide layer which evolved continuously with increasing dose of $C^+$ ions into a film with 'diamond-like' AES lineshape which is highly resistant to both $O_2$ chemisorption and $O^+$ sputtering. At the initial low doses, AES indicates that the surface is covered with a dispersed carbide layer in which each carbon atom is bonded directly to the Ni. With increasing dose, the surface C concentration increases and clustering on neighboring C atoms begins to form a continuous film with C—C bonds. These clusters are chemically bound to the surface through several C-Ni bonds. The fact that films with the latter properties have an energy and dose dependence indicates that the energy of the incoming $C^+$ ions is important to the mechanism of film growth and resulting structure and properties of the film.

Carbide bound diamond films can be deposited by the method of the invention on a wide variety of substrate materials. Any solid nonvolatile elemental substance that can be prepared to have an atomically clean surface may be used as a substrate. Especially suitable substrate materials are those known to form stable carbide compositions, such as Al, Ba, Ca, Fe, Mn, Mo, Ni, Si, Sr, Ta, Th, Ti, W, V, and Zr. Carbide bound diamond films have also been successfully applied to elemental substrates which are not otherwise known to form stable carbides. Hence, by practice of this invention a carbide bound diamond film has been formed on a gold substrate article. Hence, it is expected that Cr, Co, Cu, Pb, Mg, Pd, Pt, Sn and Zn will be suitable substrate materials for acceptance of a carbide bound diamond film by deposit according to the method of this invention. Substrates suitable for film deposition by the method of this invention may also be multielement mixture, alloys or compositions.

By employing the method of the invention carbide bound diamond films have been formed on each of the following substrate materials; nickel, silicon, gold, tantalum, and tungsten. Measurements on the carbon films so deposited indicate that they are identical and independent of the substrate upon which they are deposited. Carbide bonding to the substrate has been unambiguously identified for all five substrates. Therefore the characteristics of the deposited films, independent of the specific substrate upon which they reside, are as follows.

Auger Spectral Characteristics—The Auger electron spectroscopic (AES) results have been presented in FIGS. 4 and 5 and Table I and these results have been discussed. Summarizing these results, the first atomic layer deposited has the AES lineshape of a true carbide compound. The lineshape evolves with increasing beam dose over the next several atomic layers deposited into that of true diamond.

Ellipsometry measurements—Ellipsometry measurements at a wavelength of 6300Å and at several different angles and directions along the crystal provided a refractive index in the range 2.25-2.57; that of pure diamond is 2.41. The scatter in the data results from nonuniform film thicknesses due to the small size of the deposited film relative to the ellipsometer photon beam.

Figure 6:
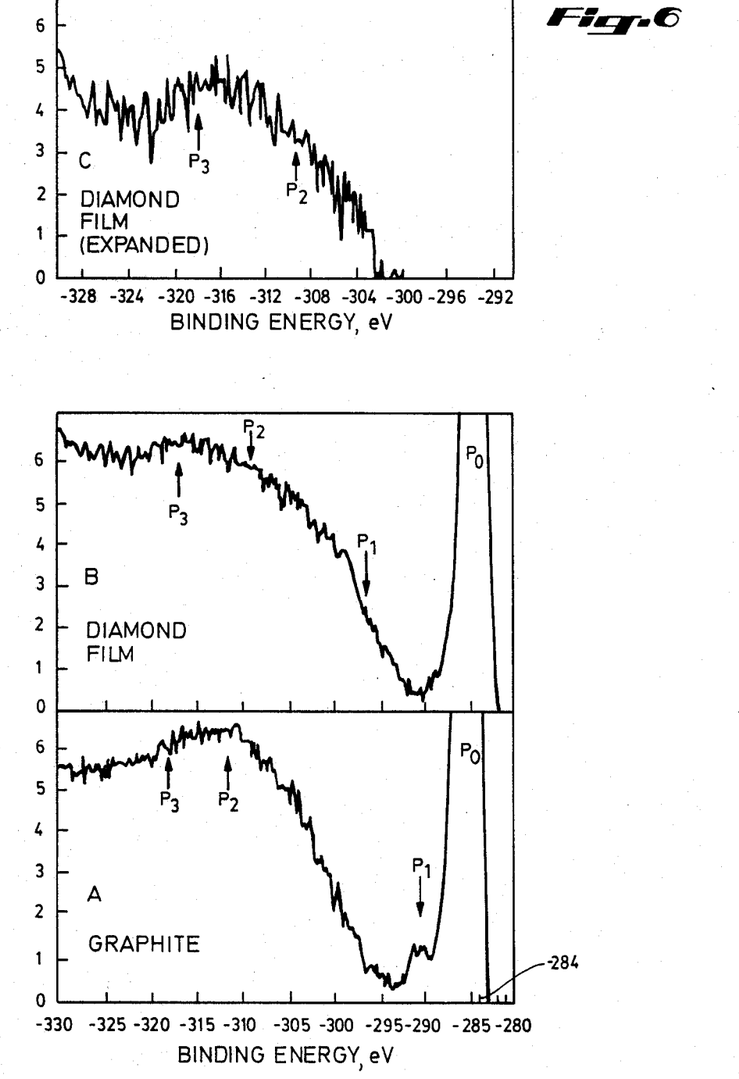
FIG. 6 is the spectra by X-Ray photoelectron spectroscopy (XPS) of (A) graphite, (B) diamond film of the invention, and (C) expanded scale drawing of a portion of the diamond spectrum. Features labelled $P_n$ are described in the text.

X-Ray photoelectron spectroscopy (XPS)—Results from XPS measurements using Mg K$\alpha$ x-rays are shown in FIG. 6 for a diamond film deposited on a Si(100) single crystal substrate. AES had previously been used on this film to show that it had the diamond lineshape. The XPS spectrum of a freshly cleaved graphite sample, measured in the same spectrometer system, is also shown in FIG. 6 for comparison to the diamond. The carbon 1s spectra and characteristic energy loss features of the graphite and diamond film samples are shown in FIGS. 6a and 6b, respectively. FIG. 6c shows the energy loss spectra for the diamond film on an expanded scale.

The carbon energy loss features of FIG. 6 have been labelled $P_i$ according to the spectra for pure diamond and graphite as published by F. R. McFeely, S. P. Kowalczyk, L. Ley, R. G. Cavell, R. A. Pollak, and D. A. Shirley, *Phys. Rev.* B9 (1974) 5268. The energy position of the various features for the published spectra are listed in Table II of the McFeely et al. publication. The XPS spectra of the diamond film deposited by the method of the invention is in agreement with the published XPS spectrum of pure diamond and different from graphite in the following ways:

(a) Graphite, glassy carbon, and microcrystalline graphite exhibit a feature labeled $P_1$ at 5-6 eV above the main C 1s peak labelled $P_0$. This 5-6 eV peak is not observed in the diamond films deposited by the method of the invention or pure diamond.

(b) The additional energy loss featured in the region labelled $P_2$ and $P_3$ are distinctly different for the pure diamond and graphite structures as shown in the published spectra by F. R. McFeely, et al., *Phys. Rev.* B9 (1974) 5268. The maximum in this feature for the diamond film of this invention is at 32 eV and the graphite sample is at 28 eV above $P_o$.

The reported range for pure diamond is 31-34.1 eV and for pure graphite is 25-28 eV.

The origins of these energy loss peaks are as follows. $P_0$ is the C 1s photoionization peak. $P_1$ is due to the plasma oscillation of $p\pi$ type electrons ($\pi$plasmons) for planar $sp^2$ bonded carbon atoms. Since diamond involves $sp^3$ coordinated carbon, it does not exhibit this feature. For tetrahedrally coordinated carbon, $P_1$ is an interband transition which appears at 11.3-12.5 eV above $P_0$. $P_2$, $P_2$ and $P_3$ arise from plasma oscillations of valence electrons. Diamond films of this invention exhibit all of the XPS energy loss features attributed to pure diamond in previous studies.

Figure 7:
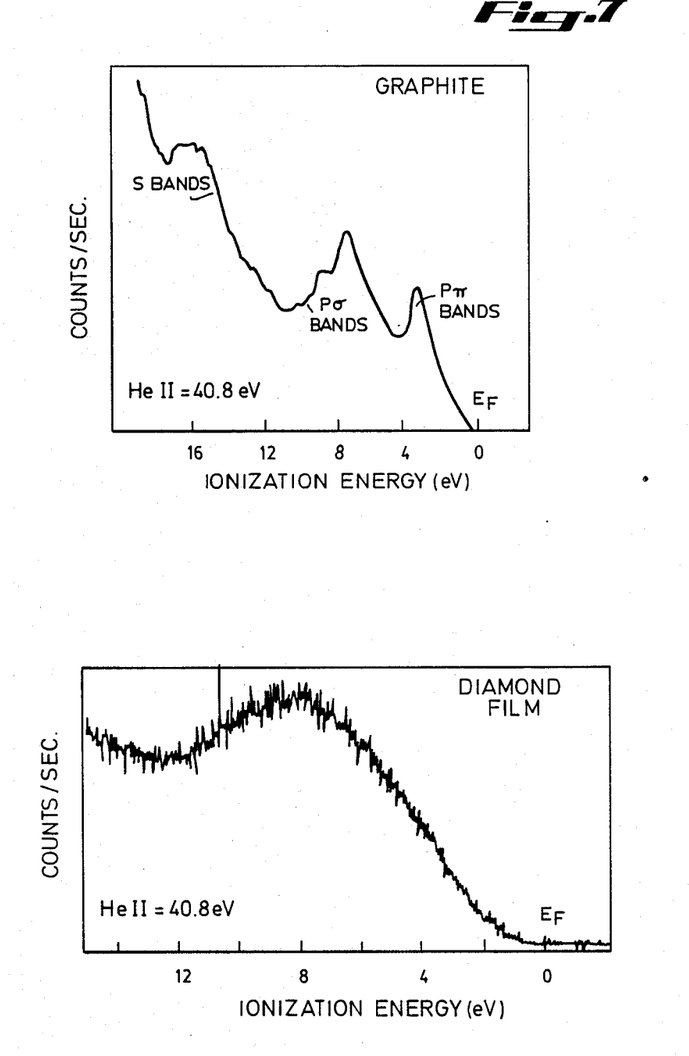
FIG. 7 is the spectra by ultraviolet photoelectron spectroscopy (UPS) of pure graphite and a diamond film of the invention using He II radiation at 40.8 eV.

Ultraviolet photoelectron spectroscopic measurements (UPS)—The UPS spectra measured with He II radiation from a diamond film of this invention on a Si(100) single crystal substrate and a pure graphite sample are shown in FIG. 7. The graphite spectrum is in agreement with previous He II spectra of pure graphite with He II (40.8 eV) radiation reported by J. A. Taylor, G. M. Lancaster, and J. W. Rabalais, J. Amer. Chem. Soc.; 100 (1978) 4441. The UPS spectrum of the diamond film of the invention is different from that of graphite and identical to the spectrum of pure diamond as published by B. B. Pate, *Surf. Sci.*, 165 (1986) 83.

The absence of the peak at 3 eV for the diamond film of the invention confirms the absence of $p\pi$ type bands. This low energy band extending from the Fermi-level to about 4 eV for graphite is due to the conduction electrons ($p\pi$ type) that are oriented perpendicular to the layers of graphite rings. For the diamond film of the invention, a recession of the density of occupied states away from the Fermi level is observed, consistent with $sp_2$ hydridization of carbon-carbon bonds and the insulator characteristics of the diamond structure.

Low energy electron diffraction (LEED)—LEED measurements on the diamond films of the invention show that they have an amorphous or polycrystalline structure.

Figure 8:
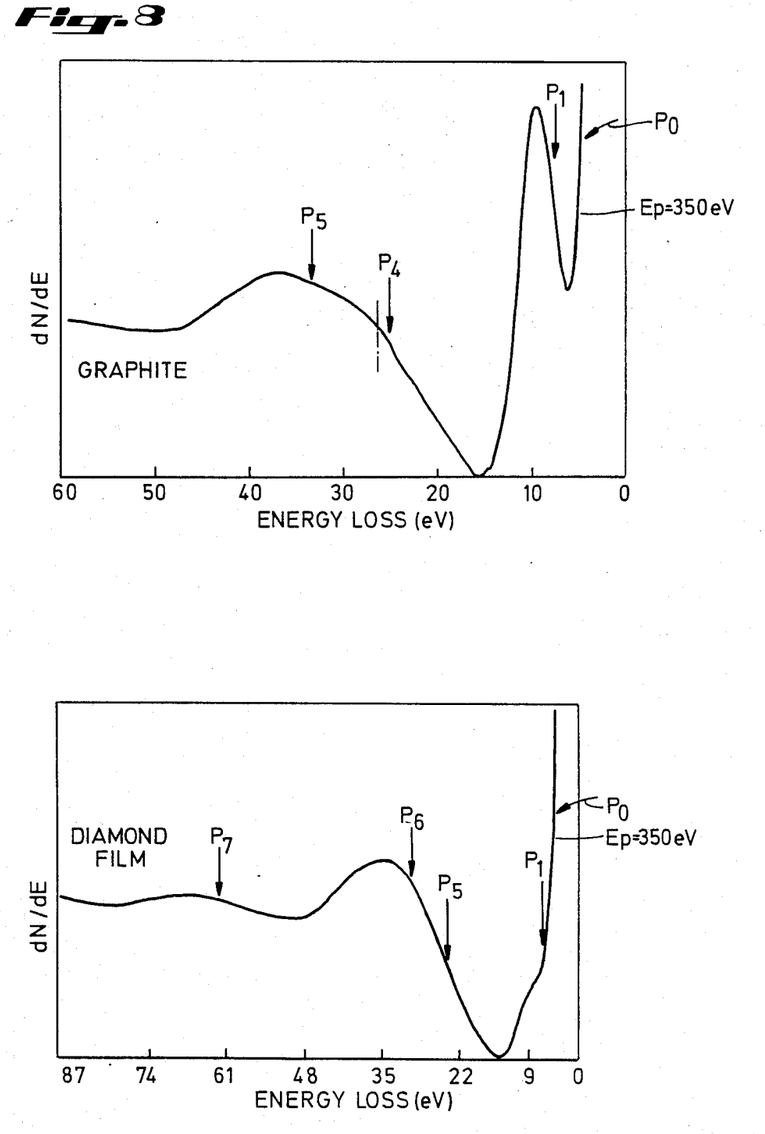
FIG. 8 is the spectra by electron energy loss spectroscopy (EELS) for a diamond film of the invention and pure graphite at 350 eV electron energy.
Figure 9:
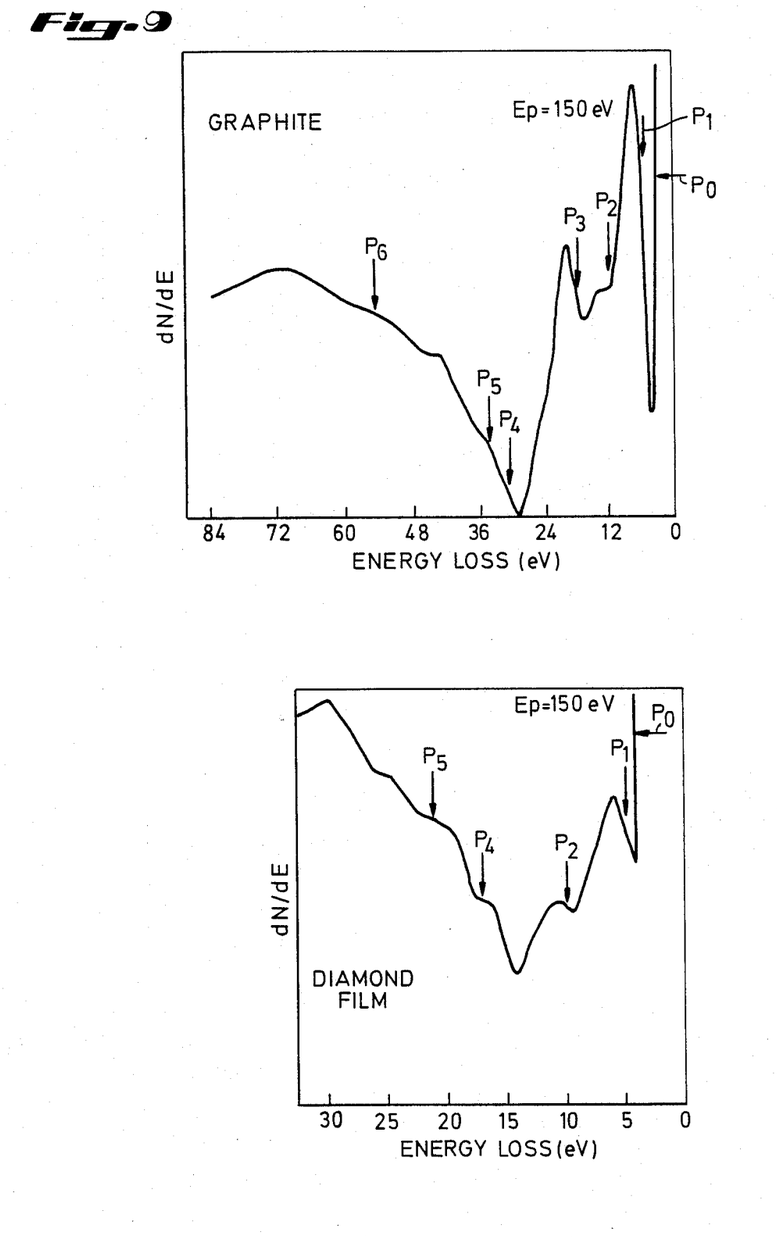
FIG. 9 is an EELS spectra for a diamond film of the invention and pure graphite at 150 eV electron energy.

Electron energy loss spectra (EELS)—EELS spectra are shown in FIGS. 8 and 9 for a 350 and 150 eV, respectively, electron beam impingent at normal incidence for a diamond film and a pure graphite sample. The plasmon loss features have been labeled in FIGS. 8 and 9. $P_0$ is the elastic scattering peak at the primary energy of 350 and 150 eV. The EELS spectra of the diamond film of the invention are in perfect agreement with the spectra from pure diamond at both energies as published by P. G. Lurie and J. M. Wilson, *Surf. Sci.*, 65 (1977) 476. Note that in the 350 eV spectrum, the large $P_1$ peak in graphite is totally absent in the diamond film. This peak is due to $p\pi$ plasmon loss features at about 7 eV, which is characteristic of unsaturated carbon systems having $sp^2$ hydridization. The complete absence of this feature in the diamond films of the invention (FIG. 9) is characteristic of $sp^3$ type bonding and a diamond structure. In the 150 eV spectra, the large $P_1$ feature of graphite is observed at 6.5 eV while the $P_1$ feature of diamond is much reduced and shifted to 5.0 eV. This $P_1$ feature in diamond arises from electronic excitations of discrete levels within the bandgap. The remaining spectral features, labelled as $P_{n'}$ in FIGS. 8 and 9 of the diamond film of the invention are in perfect agreement with the spectra of pure diamond and distinctly different from those of graphite as published by P. G. Lurie and J. M. Wilson, *Surf. Sci.*, 65 (1977) 476. In summary, the EELS spectra confirm that the films of the invention are of a diamond structure and not graphitic.

Figure 10:
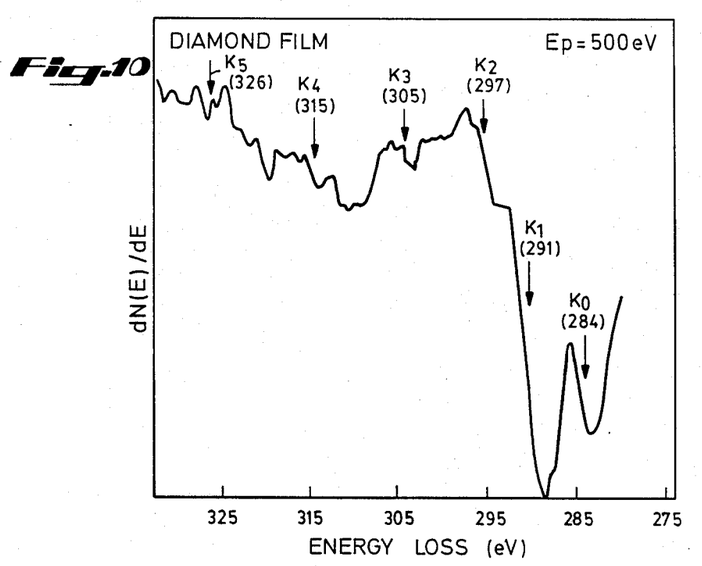
FIG. 10 is a K-shell ionization loss spectra for a diamond film of the invention.
Figure 11:
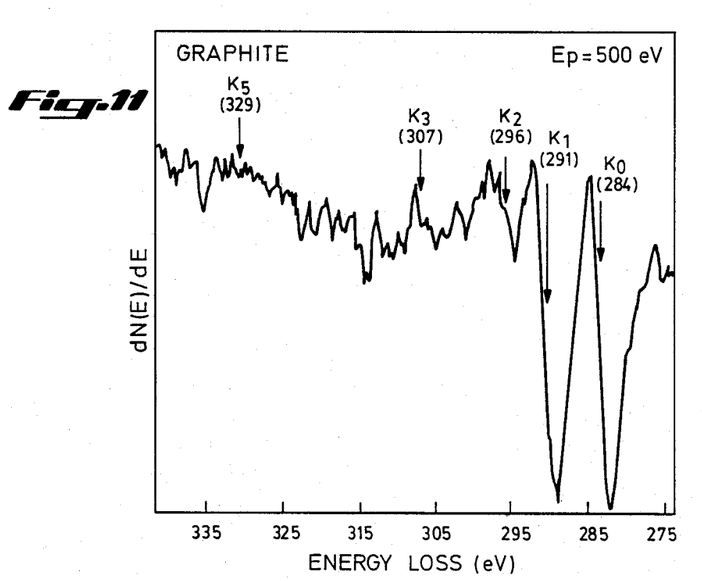
FIG. 11 is a K-shell ionization loss spectra for pure graphite.

K-Shell Ionization Loss spectra (KSIL)—KSIL spectra for diamond films of the invention and for pure graphite are shown in FIGS. 10 and 11, respectively, using an initial electron energy of 500 eV. These spectra correspond to inelastically scattered electrons that have suffered energy losses in exciting K-level carbon electrons above the valence band gap. For graphite, two very intense peaks labelled $K_0$ and $K_1$ are observed. For diamond, $K_1$ is much more intense than $K_0$ and the difference in magnitude reflects the difference in the number of empty states near the Fermi level. The observation of the $K_0$ peak in diamond has been attributed to excitation to empty states in the band gap that are generated by electron beam damage. The KSIL spectra are very similar to natural diamond with the exception of a higher intensity in $K_0$. This nonnegligible intensity at $K_0$ is due to electron beam damage of the diamond film. The KSIL spectra were acquired after the carbon film had been exposed to electron bombardment for purposes of measuring Auger spectra and EELS spectra. In summary, the KSIL spectra of the diamond films of the invention are in agreement with that of pure diamond as published by P. G. Lurie and J. M. Wilson, *Surf. Sci.*, 65 (1977) 476; and S. V. Pepper, *Appl. Phys. Lett.*, 38 (1981) 344.

The chemically bonded diamond film and method for depositing same has been described with reference to the preferred embodiments of the invention. From the description herein those having ordinary skill in the art may appreciate changes and modification that may be made which do not depart from the scope and spirit of the invention described above or claimed hereafter.

We claim:

1. A method for depositing a chemically bonded carbon based film having a diamond structure on a substrate, comprising the steps of:

positioning an electrically grounded substrate within a deposition chamber;

preparing the substrate to have an atomically clean surface and maintaining said surface in an atomically clean state during deposition by maintaining the pressure within the deposition chamber at or below $1 \times 10^{-9}$ torr;

generating from a carbon containing material a source of gaseous ions in an ionization region maintained at 1-300eV above the grounded substrate;

directing ions from the ionization region into electromagnetic mass analyser;

selecting $^{12}C^+$ ions to exit from the mass analyser;

directing said $^{12}C^+$ ion beam through a bend by passing said beam through a parallel plate condenser to eliminate line-of-sight neutral particles from said ion beam;

directing said $^{12}C^+$ ion beam through a decelerator lens immediately in front of said substrate;

impinging said ion beam on the atomically clean substrate surface at a beam energy sufficient to form a carbon layer bound to said substrate surface by carbide bonding; and impinging said ion beam on said carbide bound carbon layer at a beam energy of at least about 10 eV for a time sufficient to overlay said carbide bound carbon layer with a diamond layer of the thickness desired, said diamond layer being substantially free from included hydrogen or oxygen.

2. The method of claim 1 wherein the ion beam is impinged upon said substrate at an energy of from about 10 eV to about 250 eV.

3. The method of claim 2 wherein the energy of the impinging ion beam is from about 30 eV to about 175 eV.

4. The method of claim 2 wherein the substrate is Al, Ba, Ca, Fe, Mn, Mo, Ni, Si, Sr, Ta, Th, Ti, W, V, Zr, an alloy or mixture thereof.

5. The method of claim 2 wherein the substrate is Cr, Co, Cu, Pb, Mg, Pd, Pt, Sn, Zn, an alloy or mixture thereof.

6. The mehod of claim 3 wherein the substrate is Ni, Si, Au, Ta, or W.

7. A carbon based film deposited by ion beam deposition upon a substrate, comprising:

an anterior carbon layer substantially free of hydrogen or oxygen and having a diamond microstructure which anterior layer overlays and is chemically bonded to a posterior atomic layer of carbon that is chemically bound to said substrate surface by carbide bonding.

* * * * *

UNITED STATES PATENT AND TRADEMARK OFFICE
CERTIFICATE OF CORRECTION

PATENT NO. : 4,822,466
DATED : April 18, 1989
INVENTOR(S) : John W. Rabalais

It is certified that error appears in the above-identified patent and that said Letters Patent are hereby corrected as shown below:

In column 12, line 42, change "mehod" to --method--.

Signed and Sealed this

Thirteenth Day of February, 1990

*Attest:*

JEFFREY M. SAMUELS

*Attesting Officer*       *Acting Commissioner of Patents and Trademarks*